(12) United States Patent
Ozeki et al.

(10) Patent No.: US 12,164,204 B2
(45) Date of Patent: Dec. 10, 2024

(54) DISPLAY DEVICE

(71) Applicant: Japan Display Inc., Tokyo (JP)

(72) Inventors: Yoshitaka Ozeki, Tokyo (JP); Nobutaka Ozaki, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 18/428,904

(22) Filed: Jan. 31, 2024

(65) Prior Publication Data

US 2024/0264500 A1 Aug. 8, 2024

(30) Foreign Application Priority Data

Feb. 8, 2023 (JP) ................. 2023-017395

(51) Int. Cl.
| | | |
|---|---|---|
| G02F 1/1335 | (2006.01) | |
| G02F 1/1362 | (2006.01) | |
| G02F 1/1368 | (2006.01) | |
| H01L 27/12 | (2006.01) | |

(52) U.S. Cl.
CPC ...... *G02F 1/136227* (2013.01); *G02F 1/1368* (2013.01); *H01L 27/1248* (2013.01)

(58) Field of Classification Search
CPC .................................................. G02F 1/1335
See application file for complete search history.

(56) References Cited

U.S. PATENT DOCUMENTS

| | | | | |
|---|---|---|---|---|
| 2009/0009671 A1* | 1/2009 | Wakabayashi | .... | G02F 1/134363 349/33 |
| 2013/0016314 A1* | 1/2013 | Itou | ................... | G02F 1/133707 349/143 |
| 2013/0299819 A1 | 11/2013 | Yamazaki et al. | | |
| 2014/0362320 A1* | 12/2014 | Sato | ................... | G02F 1/134336 349/43 |
| 2017/0003530 A1* | 1/2017 | Hirosawa | .......... | G02F 1/134309 |
| 2018/0226608 A1* | 8/2018 | Nakagawa | ........... | H10K 59/873 |
| 2018/0231829 A1* | 8/2018 | Itou | ........ | G02F 1/1343 |
| 2020/0117058 A1* | 4/2020 | Kunimatsu | ....... | G02F 1/133345 |
| 2020/0124906 A1* | 4/2020 | Waka | ................ | G02F 1/136227 |
| 2021/0191207 A1* | 6/2021 | Seguchi | ............. | H01L 27/1288 |
| 2021/0305280 A1* | 9/2021 | Kitagawa | ............ | H01L 27/1251 |

FOREIGN PATENT DOCUMENTS

JP 2013-254950 A 12/2013

* cited by examiner

Primary Examiner — Sang V Nguyen (74) Attorney, Agent, or Firm — K&L Gates LLP (57) ABSTRACT

Disclosed is a display device including a substrate and a plurality of pixels over the substrate. At least one of the plurality of pixels includes a driving transistor and a liquid crystal element electrically connected to the driving transistor. The liquid crystal element has a pixel electrode, an interelectrode insulating film, a common electrode, an inorganic insulating film, a first orientation film, a liquid crystal layer, and a second orientation film. The interelectrode insulating film is located over the pixel electrode. The common electrode is located over the interelectrode insulating film and has a slit overlapping the pixel electrode. The inorganic insulating film is located over the common electrode. The first orientation film is located over the inorganic insulating film. The liquid crystal layer is located over the first orientation film. The second orientation film is located over the liquid crystal layer.

8 Claims, 7 Drawing Sheets

DISPLAY DEVICE

CROSS-REFERENCE TO RELATED APPLICATIONS

This application claims the benefit of priority to Japanese Patent Application No. 2023-017395, filed on Feb. 8, 2023, the entire contents of which are incorporated herein by reference.

FIELD

An embodiment of the present invention relates to a display device.

BACKGROUND

In recent years, semiconductor properties have been discovered in oxides, especially oxides of Group 13 elements such as indium and gallium, which has led to vigorous research and development. For example, semiconductor devices on which transistors with oxide semiconductors are mounted and display devices using such devices have been developed as disclosed in Japanese Patent Application Publication No. 2013-254950.

SUMMARY

An embodiment of the present invention is a display device. The display device includes a substrate and a plurality of pixels over the substrate. At least one of the plurality of pixels includes a driving transistor and a liquid crystal element electrically connected to the driving transistor. The liquid crystal element has a pixel electrode, an interelectrode insulating film, a common electrode, an inorganic insulating film, a first orientation film, a liquid crystal layer, and a second orientation film. The interelectrode insulating film is located over the pixel electrode. The common electrode is located over the interelectrode insulating film and has a slit overlapping the pixel electrode. The inorganic insulating film is located over the common electrode. The first orientation film is located over the inorganic insulating film. The liquid crystal layer is located over the first orientation film. The second orientation film is located over the liquid crystal layer.

DESCRIPTION OF EMBODIMENTS

Hereinafter, each embodiment of the present invention is explained with reference to the drawings. The invention can be implemented in a variety of different modes within its concept and should not be interpreted only within the disclosure of the embodiments exemplified below.

The drawings may be illustrated so that the width, thickness, shape, and the like are illustrated more schematically compared with those of the actual modes in order to provide a clearer explanation. However, they are only an example, and do not limit the interpretation of the invention. In the specification and each drawing, the same reference number is provided to an element that is the same as that which appears in preceding drawings, and a detailed explanation may be omitted as appropriate.

In the specification and the claims, unless specifically stated, when a state is expressed where a structure is arranged "over" another structure, such an expression includes both a case where the substrate is arranged immediately above the "other structure" so as to be in contact with the "other structure" and a case where the structure is arranged over the "other structure" with an additional structure therebetween.

In the specification and the claims, an expression "a structure is exposed from another structure" means a mode in which a portion of the structure is not covered by the other structure and includes a mode where the portion uncovered by the other structure is further covered by another structure. In addition, the mode expressed by this expression includes a mode where the structure is not in contact with the other structure.

In the embodiments of the present invention, when a plurality of structures is formed with the same process at the same time, these structures have the same layer structure, the same material, and the same composition. Hence, the plurality of structures is defined as existing in the same layer.

1. Overall Structure of Display Device

Figure 1:
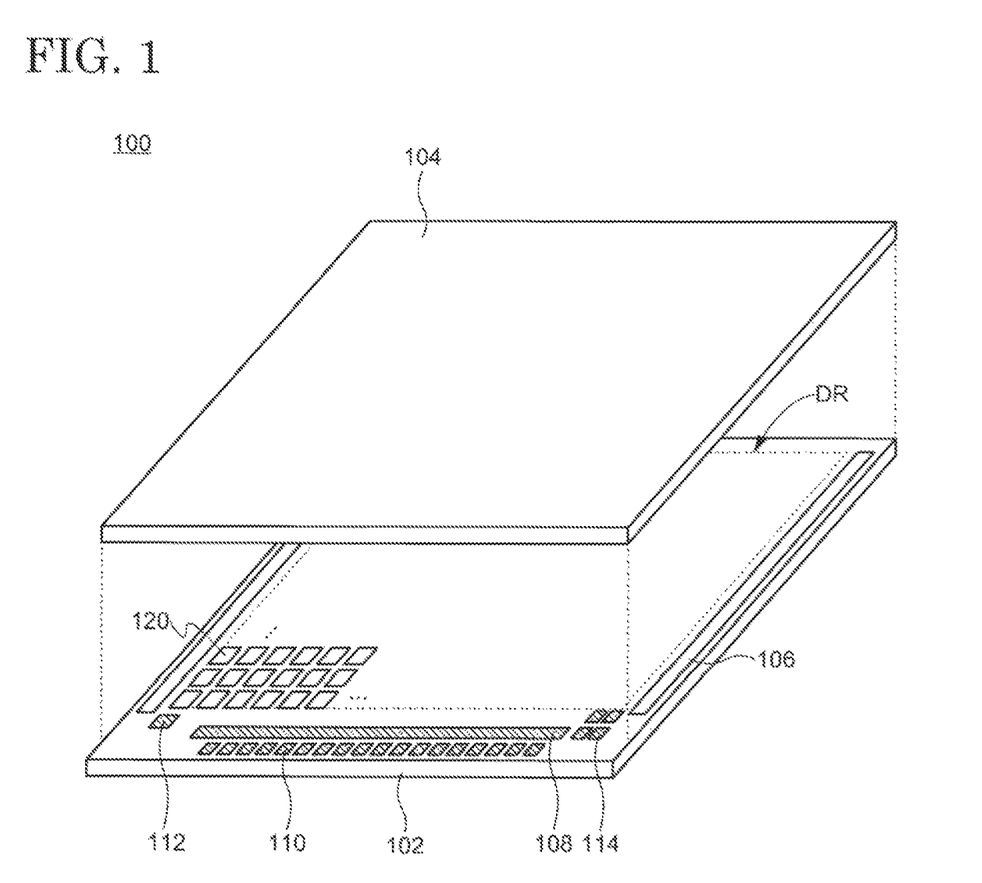
FIG. 1 is a schematic developed perspective view of a display device according to an embodiment of the present invention.

FIG. 1 shows a schematic developed perspective view of a display device 100 according to an embodiment of the present invention. The display device 100 is a liquid crystal display device and is able to function as a display device for a variety of electronic devices. For example, the display device 100 can be used as an ultra-compact display device such as virtual reality (VR) goggles, a medium or small display device used in portable communication terminals such as smartphones and tablets, a medium or large display device such as a monitor connected to a desktop computer and a television, or a large display device such as digital signage.

The display device 100 has an array substrate 102 and a counter substrate 104, between which a variety of patterned insulating films, semiconductor films, and conductive films is stacked. Appropriate combination of these insulating films, semiconductor films, and conductive films allows the fabrication of pixel circuits of a plurality of pixels 120. The region in which the plurality of pixels 120 is provided is called a display region DR. The region surrounding the display region DR is called the frame region FR. In the frame region FR, a variety of terminals (pads) is structured with a variety of patterned insulating films, semiconductor films, and conductive films, in addition to scanning line driver circuits 106 for controlling the pixels 120. The terminals include, for example, COG connection pads 108 for connecting an IC chip (not illustrated) including a signal line driver circuit, GND connection pads 112 for supplying a potential to an antistatic film (not illustrated in FIG. 1) provided over the counter substrate 104, inspection pads 114 for inspecting the display device 100, and FOG pads 110 for supplying driving signals for driving the display device 100, and the like. Note that the whole or a part of the signal line driver circuit may be formed over the array substrate 102. The FOG pads 110 are connected to an external circuit which is not illustrated via a flexible printed circuit (FPC) board.

The counter substrate 104 is disposed over the array substrate 102 to cover the plurality of pixels 120 and the scanning line driver circuits 106 and expose the terminals and is fixed to the array substrate 102 with a sealing material which is not illustrated in FIG. 1.

The scanning line driver circuits 106 and the signal line driver circuit generate control signals (gate signals, video signals, initialization signals, and the like) for controlling the pixels 120 on the basis of the driving signals, and these control signals are supplied to the pixels 120. Operation of the pixels 120 according to the control signals enables it to control the gradation of light from the backlight, which is not illustrated, for every pixel, and as a result, images can be displayed on the display region DR. Note that the external shape of the display device 100 and the shape of the display region DR are not limited to a square but may have any shape required by the electronic device equipped with the display device 100, such as a polygonal shape, a polygonal shape with rounded corners, a circular shape, an oval shape, and the like. Hereinafter, each component of the display device 100 is described in detail.

2. Substrate and Counter Substrate

The array substrate 102 and the counter substrate 104 provide physical strength to the display device 100 and also provide a surface for arranging a variety of components such as the pixels 120, the scanning line driver circuits 106 and the like to realize the functions of a display device. The array substrate 102 and the counter substrate 104 are configured to transmit the light from the backlight, i.e., visible light, and include, for example, glass, quartz, or a polymer such as a polyimide, a polyamide, and a polycarbonate. The array substrate 102 and/or the counter substrate 104 may be flexible.

3. Pixel

Figure 2:
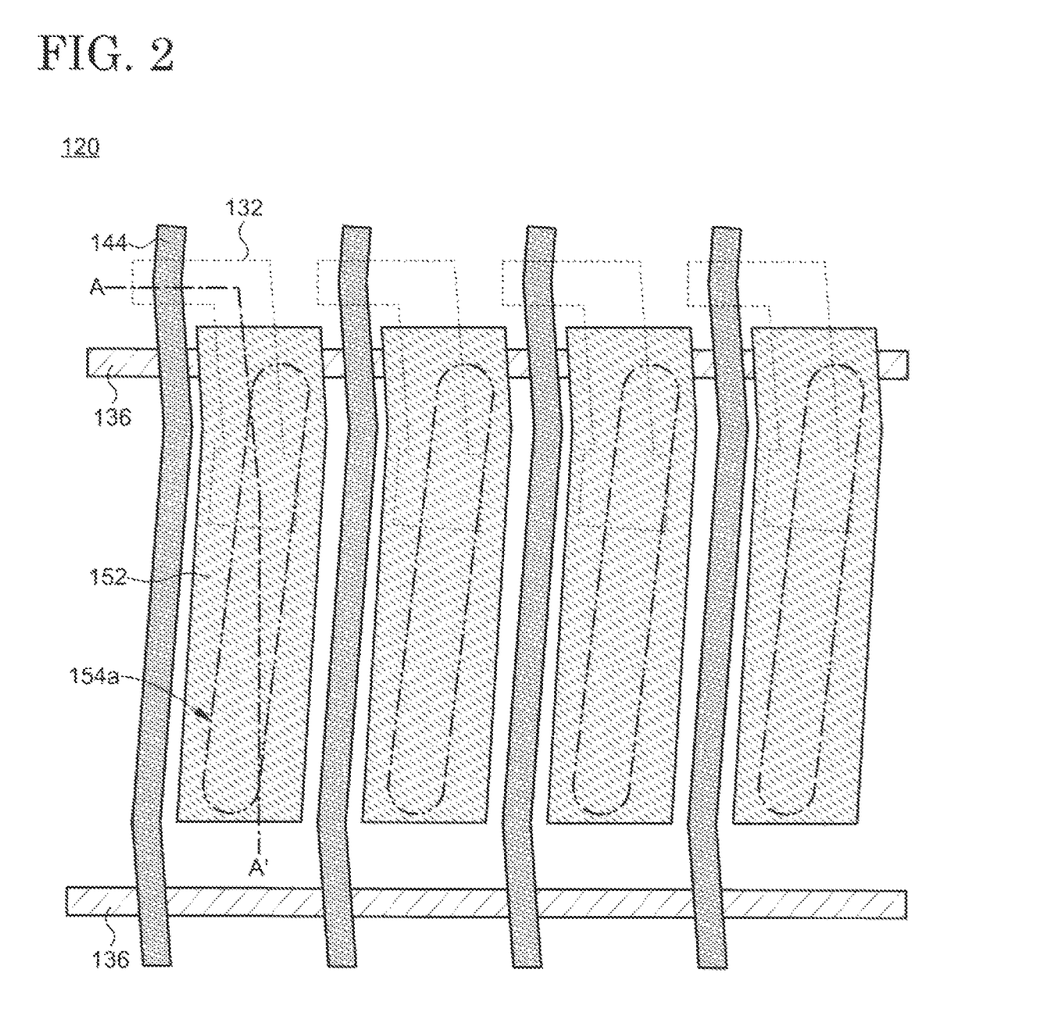
FIG. 2 is a schematic top view of a display device according to an embodiment of the present invention.
Figure 3:
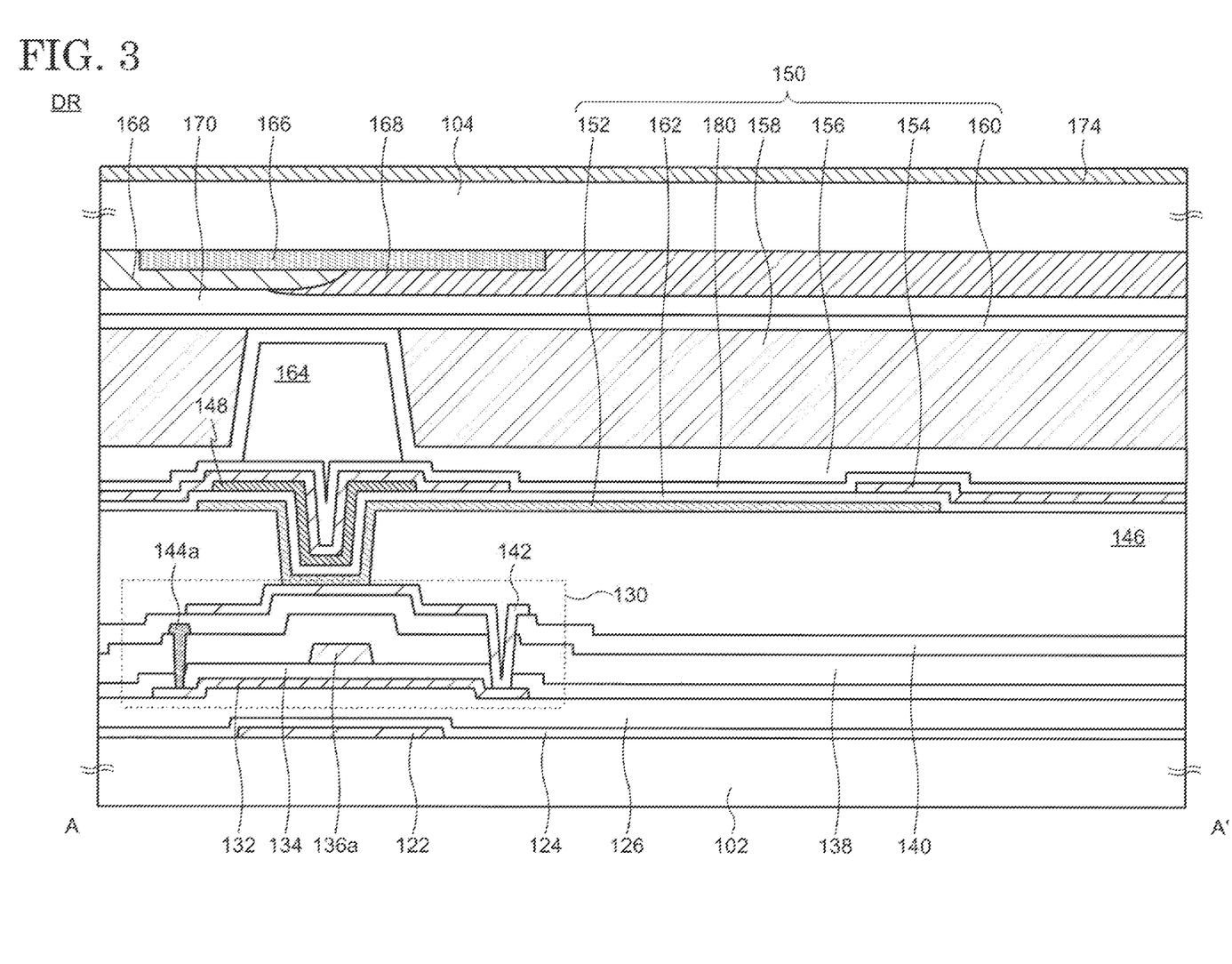
FIG. 3 is a schematic cross-sectional view of a display device according to an embodiment of the present invention.

A schematic top view of the pixels 120 forming the display region DR is shown in FIG. 2, and a schematic view of a cross section along the chain line A-A' in FIG. 2 is shown in FIG. 3. There are no restrictions on the arrangement of the pixels 120, and a variety of arrangements such as the stripe arrangement, the pen-tile arrangement, the S-stripe arrangement, the diamond pen-tile arrangement, and the like may be employed.

Each pixel 120 is provided with a liquid crystal element 150 and a pixel circuit electrically connected to the liquid crystal element 150 and controlling the liquid crystal element 150 on the basis of the control signals. The control signals are supplied via scanning lines 136 extending from the scanning line driver circuits 106 and signal lines 144 extending from the signal line driver circuit (see FIG. 2.). There is no particular restriction on the arrangement of the scanning lines 136 and the signal lines 144, and any known arrangement may be applied as appropriate. For example, a plurality of scanning lines 136 may be arranged almost parallel to one another, and a plurality of signal lines 144 each having a bending structure may be arranged to intersect the scanning lines 136 as shown in FIG. 2. Although not illustrated, the signal lines 144 having no bending structure and extending in a straight line may be arranged.

(1) Pixel Circuit

The pixel circuit has at least one or a plurality of transistors and may further have one or a plurality of capacitance elements. FIG. 3 shows, as a component of the pixel circuit, a driving transistor 130 electrically connected to the liquid crystal element 150 and supplying a potential corresponding to the video signal to the liquid crystal element 150. Unlike the circuit transistor 190 structuring the scanning line driver circuits 106 described below, the driving transistor 130 has a semiconductor film 132 including an oxide semiconductor. Specifically, the driving transistor 130 includes: a semiconductor film 132; a gate electrode 136a overlapping the semiconductor film 132 and forming the scanning line 136; a gate insulating film 134 arranged between the semiconductor film 132 and the gate electrode 136a; a second interlayer insulating film 138 and a third interlayer insulating film 140 covering the semiconductor film 132 and the gate electrode 136a; a drain electrode 142 electrically connected to the semiconductor film 132 through a through hole passing through the third interlayer insulating film 140 to the gate insulating film 134; and a source electrode 144a electrically connected to the semiconductor film 132 through a through hole passing through the second interlayer insulating film 138 and the gate insulating film 134. The source electrode 144a also serves as the signal line 144. The driving transistor 130 shown in FIG. 3 is a so-called top-gate type transistor, but the driving transistor 130 may also be a bottom-gate type transistor and may have gate electrodes both over and under the semiconductor film 132. When a plurality of transistors is provided in each pixel circuit, the semiconductor films of the transistors other than the driving transistor 130 may contain an oxide semiconductor or silicon.

As an optional component, the display device 100 may also have a light-shielding film 122 under each pixel circuit. The light-shielding film 122 in this embodiment is provided over the array substrate 102 and overlaps the driving transistor 130. The light from the backlight (not illustrated) provided under the array substrate can be prevented from entering the driving transistor 130 by arranging the light-shielding film 122. As a result, characteristic changes and degradation of the driving transistor 130 caused by the light can be prevented. The light-shielding film 122 may be formed as a single film or a multi-layer film containing, for example, a metal such as molybdenum, chromium, nickel, hafnium, tungsten, titanium, copper, and aluminum or an alloy thereof.

The oxide semiconductor structuring the semiconductor film 132 may be selected from oxides of Group 13 elements such as indium and gallium. The oxide semiconductor may contain a plurality of different Group 13 elements, and indium-gallium oxide (IGO) is represented as an example. The oxide semiconductor may further contain a Group 12 element. A typical oxide semiconductor containing a Group 12 element is represented by indium-gallium-zinc oxide (IGZO). The semiconductor film 132 may also contain other elements and may include a Group 14 element such as tin and a Group 4 element such as titanium and zirconium.

The scanning line 136, the signal line 144, and the drain electrode 142 are also configured to include a metal such as molybdenum, chromium, tungsten, titanium, copper, aluminum, hafnium, and nickel or an alloy thereof, for example. The scanning lines 136 and the signal lines 144 may be composed of a single layer or multiple layers of the metal layers of these alloys or a simple substance. Each of the gate insulating film 134, the second interlayer insulating film 138, and the third interlayer insulating film 140 may be configured as a single-layer or multilayer film containing an inorganic compound. As an inorganic compound, a silicon-containing inorganic compound such as silicon nitride, silicon oxide, silicon oxynitride, and silicon nitride oxide is represented. Alternatively, an aluminum-containing inorganic compound such as aluminum oxide, aluminum oxy nitride, and aluminum nitride may be used as the inorganic compound.

A planarization film 146 containing a polymer such as an acrylic resin, an epoxy resin, a polyimide resin, a polyamide resin, and a silicone resin is provided over the drain electrode 142 and the third interlayer insulating film 140. The planarization film 146 is capable of mitigating the unevenness caused by the pixel circuits and providing a relatively flat top surface, allowing the formation of the liquid crystal element 150 over a flat surface.

(2) Liquid Crystal Element

The liquid crystal element 150 is a transmissive liquid crystal element and includes, as its basic components, a pixel electrode 152, an interelectrode insulating film 162 over the pixel electrode 152, a common electrode 154 over the interelectrode insulating film 162, an inorganic insulating film 180 over the common electrode 154, a first orientation film 156 over the inorganic insulating film 180, a liquid crystal layer 158 over the first orientation film 158, a second orientation film 160 over the liquid crystal layer 158, and a spacer 164 to maintain the thickness of the liquid crystal layer 158 as shown in FIG. 3. As can be understood from FIG. 3, the liquid crystal element 150 is a so-called FFS (Fringe Field Switching) liquid crystal device, in which the orientation of the homogeneously oriented liquid crystal molecules in the liquid crystal layer 158 is changed by applying an electric field in the horizontal direction, and the gradation is controlled according to the degree of change in the orientation of the liquid crystal molecules.

The pixel electrode 152 is electrically connected to the drain electrode 142 of the driving transistor 130 through a through hole formed in the planarization film 146. As a result, the potential corresponding to the video signal is supplied to the pixel electrode 152 through the signal line 144 and the driving transistor 130. Note that the display device 100 is driven by the so-called inversion-driving method. Therefore, the polarity of the potential corresponding to the video signal is inverted frame-by-frame with respect to the constant potential applied to the common electrode 154.

The pixel electrode 152 also transmits visible light in order to transmit the light from the backlight. Therefore, the pixel electrode 152 includes a light-transmitting conductive oxide such as indium-tin oxide (ITO) and indium-zinc oxide (IZO), for example. As shown in FIG. 2, the pixel electrodes 152 are provided for each pixel 120. The pixel electrodes 152 may have a bent shape along the signal lines 144 as shown in FIG. 2 or may have a rectangular shape without a bent structure, although not illustrated.

The interelectrode insulating film 162 insulates the pixel electrode 152 and the common electrode 154. The interelectrode insulating film 162 is composed as a monolayer or multilayer film containing, for example, a silicon-containing inorganic compound and an aluminum-containing inorganic compound. Note that a storage capacitance may be formed in each pixel circuit by arranging the pixel electrode 152 and a capacitance electrode (not illustrated) to face each other through the interelectrode insulating film 162.

The common electrode 154 faces the pixel electrode 152 through the interelectrode insulating film 162. Here, the common electrode 154 is provided over a plurality or all of the pixels 120. That is, the common electrode 154 is shared by a plurality or all of the pixels 120. The common electrode 154 also includes a light-transmitting conductive oxide such as ITO and IZO to transmit visible light. Furthermore, the common electrode 154 has a slit 154a overlapping the pixel electrode 152 as shown in FIG. 2, and the pixel electrode 152 and the interelectrode insulating film 162 are exposed through the slit 154a. There is no restriction on the number of slits 154a provided in each pixel 120. Therefore, there may be one or more slits 154a in each pixel 120. The longitudinal direction of the slit 154a may be orthogonal to the scanning line 136 or may be inclined from the scanning lines 136 (or the direction of the arrangement of the pixels 120 along the signal lines 144) as shown in FIG. 2. For example, the longitudinal direction of the slit 154a may be inclined at an angle equal to or more than 75° and less than 90° from the direction in which the scanning lines 136 extend. As described above, a predetermined constant potential is supplied to the common electrode 154. The potential applied to the common electrode 154 may be a ground potential (0 V) or may be a negative potential with respect to the ground potential in view of the influences of various parasitic capacitances in the pixel 120 such as the capacitance formed by the common electrode 154, the interelectrode insulating film 162, and the pixel electrode 152. For example, the potential applied to the common electrode 154 may be equal to or higher than −1.0 V and equal to or lower than −0.1 V and typically −0.5 V.

The inorganic insulating film 180 covering the common electrode 154 is composed of a monolayer or multilayer film containing the aforementioned silicon-containing inorganic compound. In the slit 154a of the common electrode 154, the inorganic insulating film 180 is in contact with the interelectrode insulating film 162. That is, the inorganic insulating film 180 also covers the periphery of the slit 154a. The thickness of the inorganic insulating film 180 may be set to be smaller than the thicknesses of the gate insulating film 134, the second interlayer insulating film 138, the third interlayer insulating film 140, the first orientation film 156, and the second orientation film 160. For example, the thickness of the gate insulating film 134 may be set in the range equal to or more than 80 nm and equal to or less than 120 nm, the thicknesses of the second interlayer insulating film 138 and the third interlayer insulating film 140 may be set in the range equal to or more than 300 nm and equal to or more than 500 nm, and the thickness of the inorganic insulating film 180 may be set in the range equal to or more than 20 nm and equal to or less than 70 nm. Employment of a thickness in this range (e.g., a thickness of 50 nm) in the inorganic insulating film 180 allows the inorganic insulating film 180 to be significantly thin compared with other insulating films, thereby suppressing the absorption of the light from the backlight by the inorganic insulating film 180 as much as possible and also suppressing the charge transfer between the first orientation film 156 and the common electrode 154. As a result, an unintended shift of the potential of the common electrode 154 (Vcom shift) can be prevented. The prevention of a Vcom shift by the inorganic insulating film 180 will be described below.

Figure 4:
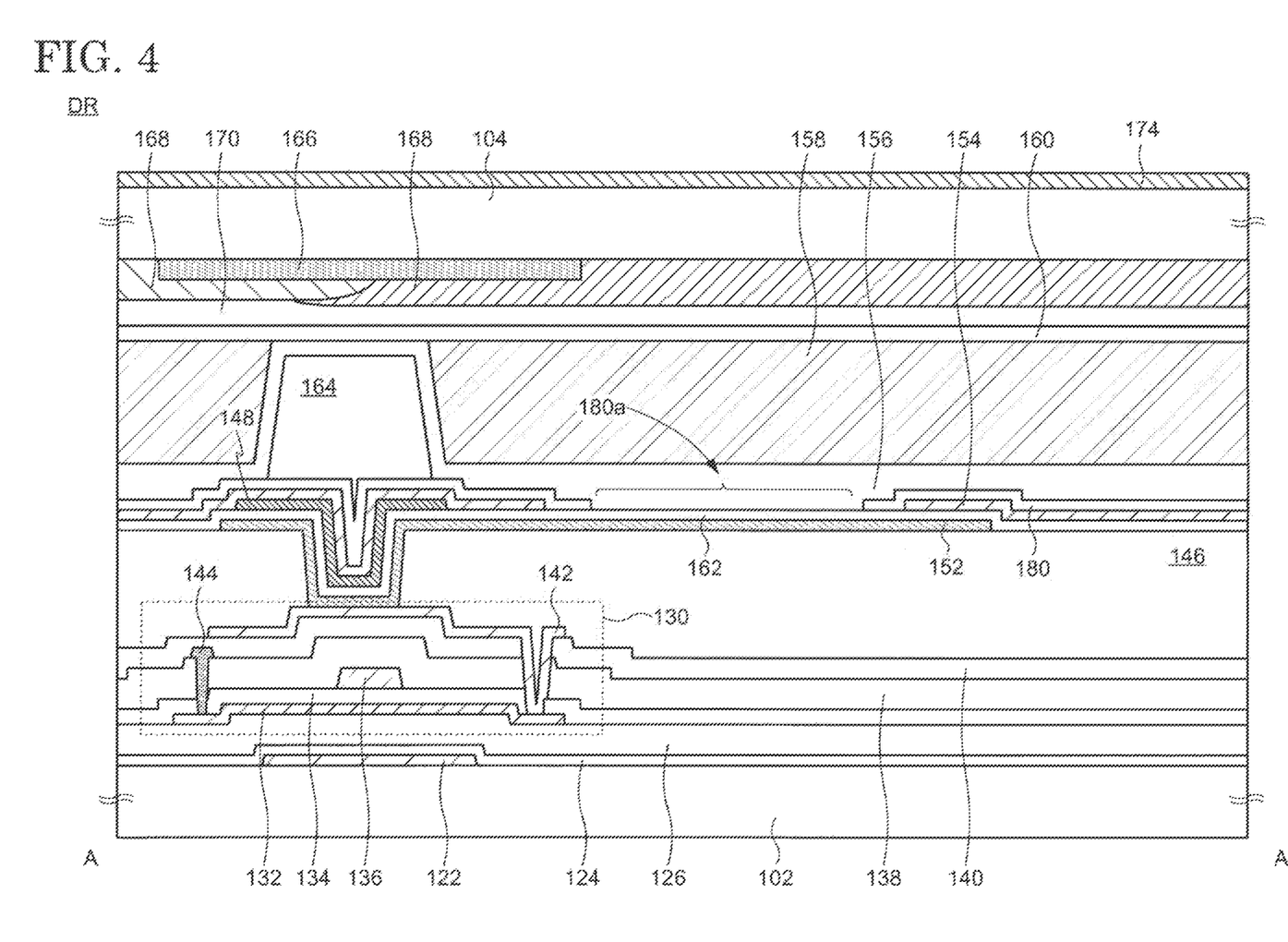
FIG. 4 is a schematic cross-sectional view of a display device according to an embodiment of the present invention.

The inorganic insulating film 180 need not cover the entire interelectrode insulating film 162 or the entire pixel electrode 152 in each pixel 120 and may have an opening 180a overlapping the slit 154a of the common electrode 154 (see FIG. 2.) as shown in FIG. 4, for example. In this case, the interelectrode insulating film 162 and the first orientation film 156 are in contact with each other in the opening 180a. However, it is preferred to form the opening 180a so as to cover the entire periphery of the slit 154a of the common electrode 154 in each pixel 120 and to seal the common electrode 154 with the interelectrode insulating film 162 and the inorganic insulating film 180 as shown in FIG. 4 in order to prevent the Vcom shift.

The first orientation film 156 and the second orientation film 160 are provided to control the orientation direction of the liquid crystal molecules structuring the liquid crystal layer 158, and both contain a polymer such as a polyimide and a polyester. The first orientation film 156 and the second orientation film 160 are formed using a wet deposition method such as an ink-jet method, a spin-coating method, a printing method, and a dip-coating method, and their surfaces are subjected to a rubbing process. Alternatively, the first orientation film 156 and the second orientation film 160 may be formed by a photo-alignment treatment. In each pixel 120, the first orientation film 156 and the second orientation film 160 each have a thickness equal to or more than 70 nm and equal to or less than 90 nm, for example, and are formed at a thickness larger than the thickness of the inorganic insulating film 180 in the region which does not overlap a light-shielding film 166 described below. The first orientation film 156 and the second orientation film 160 are provided so that the directions in which the liquid crystal molecules are oriented are parallel to each other.

The spacer 164 includes a resin such as an acrylic resin and is provided between adjacent pixels 120, for example. The spacer 164 shown in FIG. 3 is fixed over the inorganic insulating film 180 and is covered by the first orientation film 156, but the thickness of the liquid crystal layer 158 may be maintained by dispersing spherical spacers in the liquid crystal layer 158, for example. In this case, the spacers are placed between the first orientation film 156 and the second orientation film 160.

(3) Other Components

The display device 100 may have an auxiliary wiring 148 as an optional component. The auxiliary wiring 148 is provided to be in contact with the common electrode 154 in order to suppress a voltage drop in the common electrode 154 and is formed, for example, as a single-layer or multi-layer film containing a metal such as aluminum, titanium, tungsten, molybdenum, copper, nickel, and tantalum or an alloy thereof. In the example shown in FIG. 3, the auxiliary wiring 148 is provided directly below the common electrode 154, but the auxiliary wiring 148 may be placed directly over the common electrode 154. Although there is no restriction on the position where the auxiliary wiring 148 is provided, the auxiliary wiring 148 is preferably arranged so as to overlap the light-shielding film 122, the through hole formed in the planarization film 146, or the driving transistor 130 and to be parallel to the scanning lines 136 and signal lines 144 in order not to block the light whose graduation is controlled by the liquid crystal layer 158 as shown in FIG. 3.

The counter substrate 104 is provided with a color filter 168 absorbing a part of the light passing through the liquid crystal element 150 to give color information and a light-shielding film (black matrix) 166 shielding unnecessary light. The color filter 168 is provided in such a way that absorption characteristics are different between adjacent pixels 120. The light-shielding film 166 may be composed of a resin containing a black or similarly colored pigment and is preferably arranged to overlap the light-shielding film 122, the through hole formed in the planarization film 146, and the driving transistor 130. In order to block unnecessary light while allowing the light configured to pass through the color filter 168 to pass through the color filter 168, the light-shielding film 166 is provided to cover the space between adjacent pixels 120. Accordingly, the light-shielding film 166 is formed as a film having a plurality of openings overlapping the plurality of pixels 120.

Furthermore, an overcoat 170 covering the color filter 168 and the light-shielding film 166 may be provided over the counter substrate 104 as an optional component. The overcoat 170 may also be composed of one or a plurality of films containing a silicon-containing inorganic compound or may be formed so as to contain a polymer such as an acrylic resin, an epoxy resin, a polyimide, and a polyamide. The formation of the overcoat 170 prevents impurities contained in the counter substrate 104, the color filter 168, or the light-shielding film 166 from penetrating to the liquid crystal element 150 and also mitigates the unevenness caused by the color filter 168 and the light-shielding film 166 to provide a relatively flat surface. Thus, the flat second orientation film 160 can be formed over the overcoat 170.

In addition, the display device 100 may have a conductive antistatic film 174 over the counter substrate 104 as an optional component. The antistatic film 174 also includes a light-transmitting conductive oxide such as ITO and IZO. The antistatic film 174 is electrically connected to the GND connection pad 112 with a leading wiring which is not illustrated. The antistatic film 174 shields the external electric field and prevents the liquid crystal element 150 from being affected by the external electric field.

4. Structure of Frame Region (1) Structure of Edge Portion of Display Device

Figure 5:
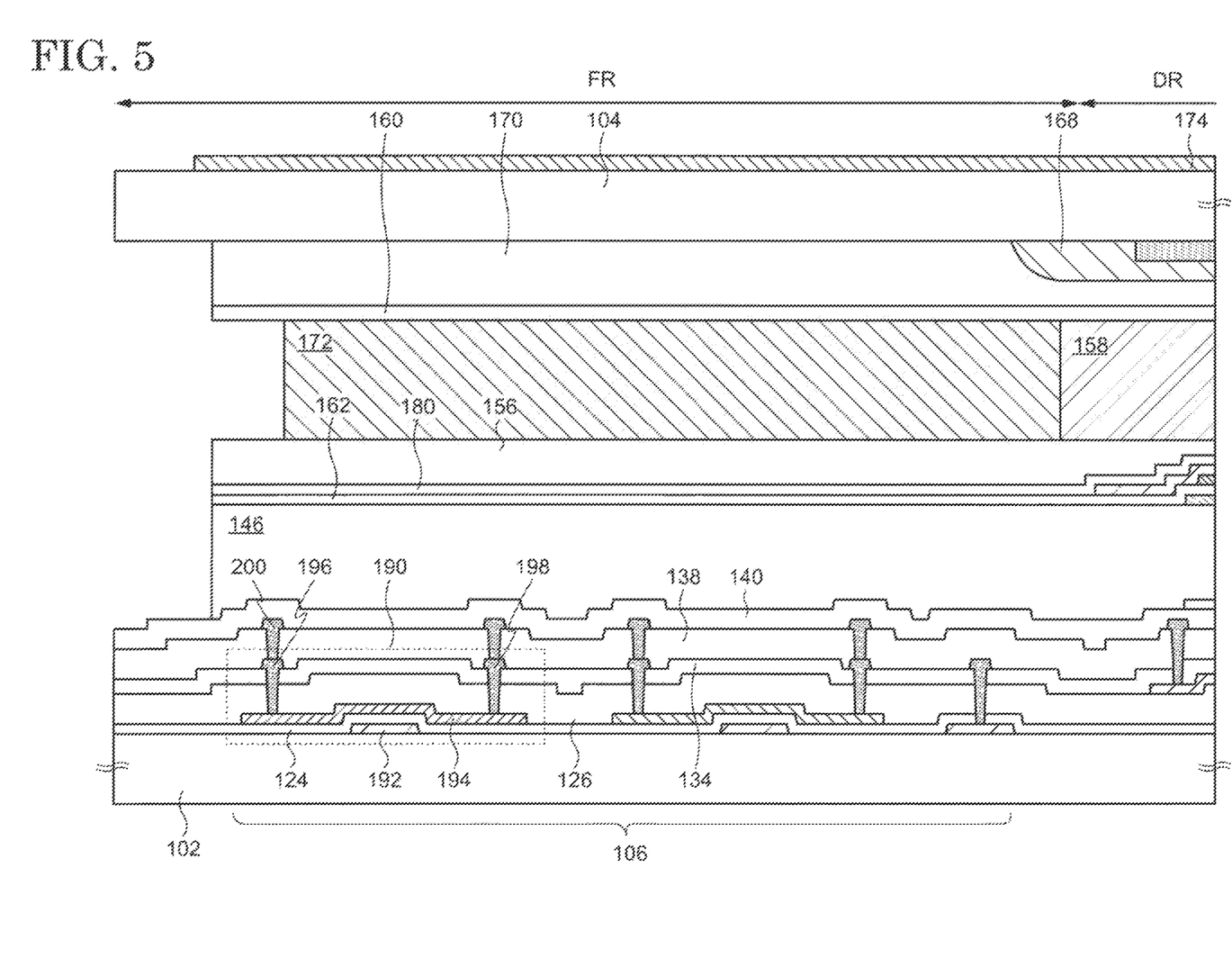
FIG. 5 is a schematic cross-sectional view of a display device according to an embodiment of the present invention.

As described above, the scanning line driver circuits 106 are provided in the frame region FR. A schematic view of a cross section of the frame region FR is shown in FIG. 5. As shown in FIG. 5, the array substrate 102 and the counter substrate 104 are fixed to each other by the sealing material 172 provided in the frame region FR, and the liquid crystal layer 158 is sealed in the space formed by the array substrate 102, the counter substrate 104, and the sealing material 172.

The scanning line driver circuits 106 are configured by appropriately connecting a plurality of circuit transistors 190 and capacitance elements which are not illustrated. The configuration of the circuit transistors 190 may also be determined arbitrarily. For example, the circuit transistor 190 is composed of a gate electrode 192, a semiconductor film 194 overlapping the gate electrode 192, a gate insulating film 124 between the gate electrode 192 and the semiconductor film 194, a first interlayer insulating film 126 covering the gate electrode 192 and the semiconductor film 194, a pair of terminals 196 and 198 electrically connected to the semiconductor film 194 via through holes provided in the first interlayer insulating film 126 and the gate insulating film 134, and the like as shown in FIG. 5. The pair of terminals 196 and 198 may be electrically connected to the wirings 200 in through holes provided in the second interlayer insulating film 138. The semiconductor film 194 of the circuit transistor 190 may be configured to include silicon, which allows the formation of the scanning line driver circuits 106 capable of being driven at high speed. The gate insulating film 124 and the first interlayer insulating film 126 may be composed of the silicon-containing inorganic compound or the aluminum-containing inorganic compound described above. The gate electrode 192, the pair of terminals 196 and 198, and the wirings 200 may also be formed to include a metal such as aluminum, titanium, tungsten, molybdenum, copper, nickel, and tantalum or an alloy thereof.

Although not illustrated, a plurality of display devices 100 is simultaneously formed using a pair of large substrates called mother glass as the array substrate 102 and counter substrate 104, respectively, and the large substrates are then divided into individual pieces to obtain each display device 100. Here, at the edge portion of each display device 100 which will be located on dividing lines (also called scribe lines), the planarization film 146 and the components provided thereover (the interelectrode insulating film 162, the inorganic insulating film 180, the first orientation film 156, the sealing material 172, and the like) are patterned so as not to overlap the dividing lines to facilitate the dividing process. As a result, the third interlayer insulating film 140 is exposed at the periphery of the display device 100. Thus, the side surfaces of the planarization film 146 and the sealing material 172 are located inside (on the display region DR side) of the side surfaces of the array substrate 102, the counter substrate 104, the first interlayer insulating film 126, the second interlayer insulating film 138, and the third interlayer insulating film 140, for example.

(2) Structure of Terminal

Figure 6A:
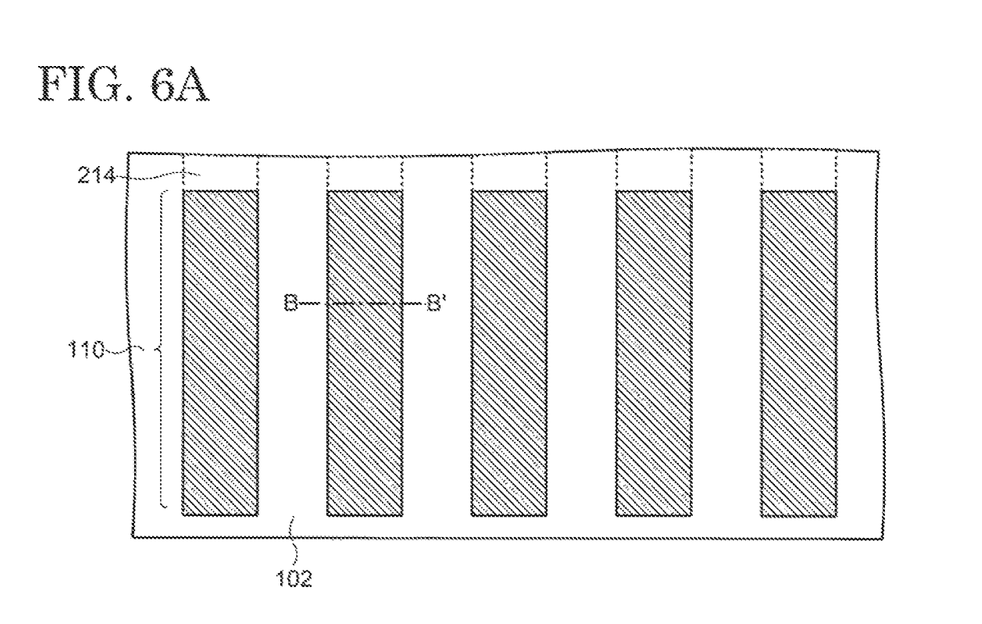
FIG. 6A is a schematic top view a of display device according to an embodiment of the present invention.
Figure 6B:
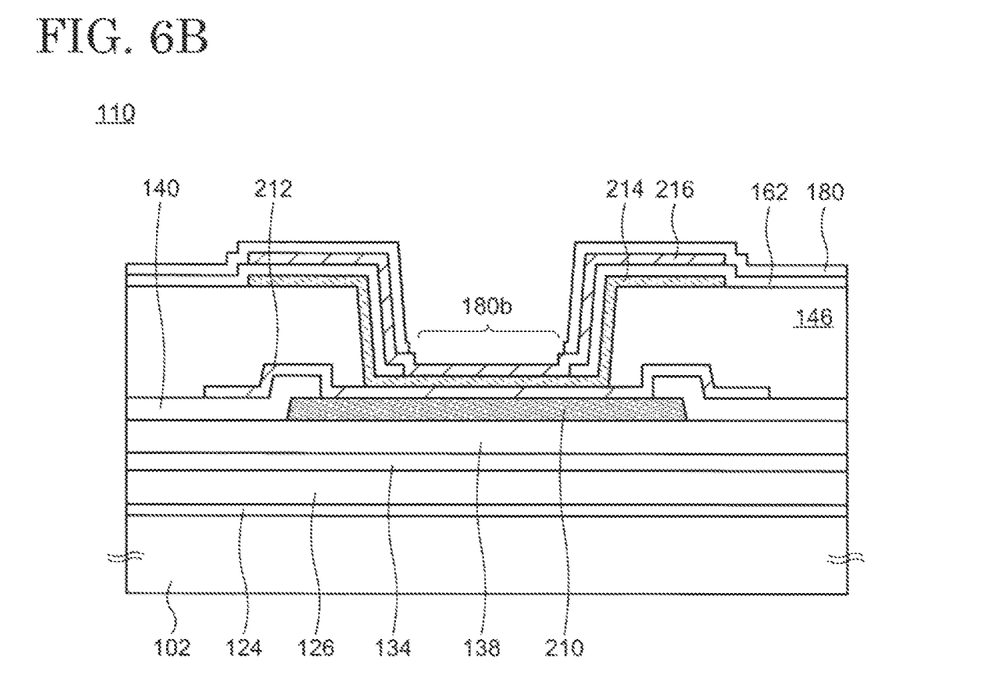
FIG. 6B is a schematic cross-sectional view of a display device according to an embodiment of the present invention.

As described above, in addition to the scanning line driver circuits 106, the variety of terminals including the COG connection pads 108, the GND connection pads 112, the inspection pads 114, and the FOG pads 110 is also formed in the frame region FR, and the supply of driving signals and the electrical connection of other components (for example, an external circuit for the antistatic film and the inspection) are performed through these terminals. Therefore, an opening is provided in the inorganic insulating film 180 over each terminal to ensure the electrical connection. As a specific example, a schematic top view of the FOG pads 110 is shown in FIG. 6A, and a schematic view of a cross section along the chain line B-B' of FIG. 6A is shown in FIG. 6B.

As shown in these drawings, the FOG pads 110 each have a wiring 210 for supplying the driving signals to the signal line driver circuit. The wiring 210 is in the same layer as the signal line 144 constituting the source electrode 144a. An edge portion of the source electrode 144a is covered by the third interlayer insulating film 140, and a protective electrode 212 is provided over the third interlayer insulating film 140 to be in contact with the portion exposed from the third interlayer insulating film 140. The protective electrode 212 is in the same layer as the drain electrode 142 and includes a light-transmitting conductive oxide such as ITO and IZO. Therefore, it is possible to prevent oxidation of the surface of the wiring 210 by forming the protective electrode 212 in the processes after the wiring 210 is formed, thereby preventing an increase in contact resistance.

The planarization film 146 is provided over the protective electrode 212 to cover the edge portion of the protective electrode 212 and expose a portion of the protective electrode 212. The planarization film 146 has an opening overlapping the wiring 210 and the protective electrode 212, and a first connection electrode 214 existing in the same layer as the pixel electrode 152 is electrically connected to the protective electrode 212 through this opening. Similarly, the interelectrode insulating film 162 is provided to cover the edge portion of the first connection electrode 214 and to expose a portion of the first connection electrode 214. The interelectrode insulating film 162 also has an opening to expose the first connection electrode 214, and a second connection electrode 216 existing in the same layer as the common electrode 154 is electrically connected to the first connection electrode 214 through this opening. In addition, the inorganic insulating film 180 is formed to cover the edge portion of the first connection electrode 214 and to have an opening 180b overlapping the wiring 210, the protective electrode 212, the first connection electrode 214, and the second connection electrode 216. Hence, a portion of the second connection electrode 216 is exposed through the opening 180b, and the electrical connection is carried out at this exposed portion.

Figure 7:
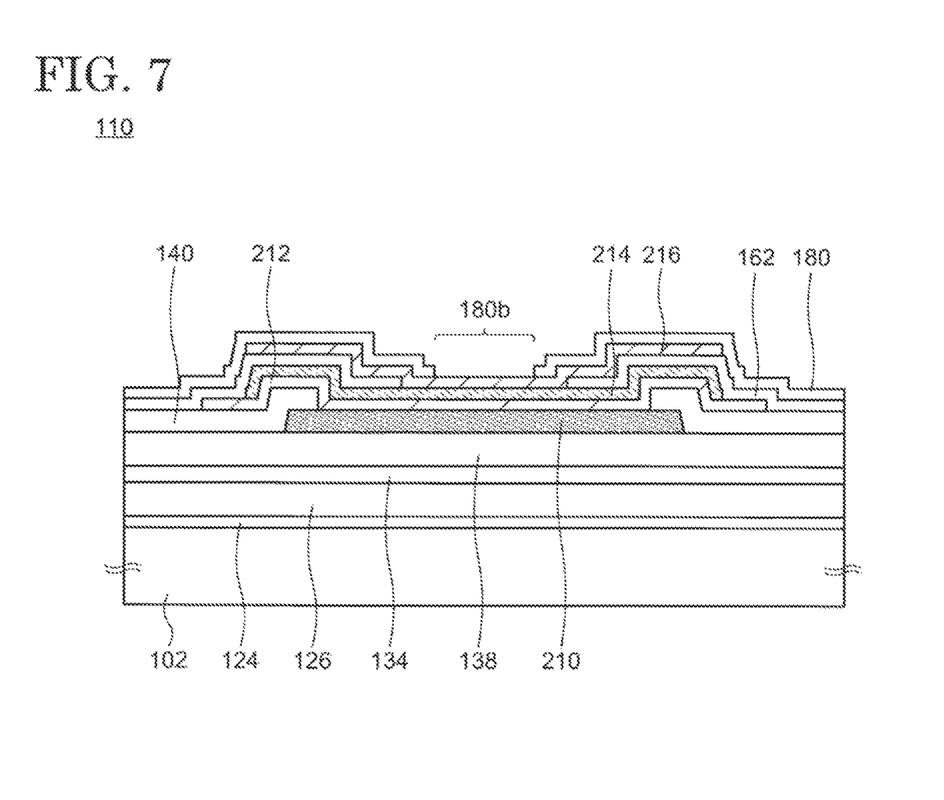
FIG. 7 is a schematic cross-sectional view of a display device according to an embodiment of the present invention.

As shown in FIG. 7, the planarization film 146 may not be provided around the FOG pads 110, and the protective electrode 212 in contact with the third interlayer insulating film 140 and the wiring 210 may be provided over the third interlayer insulating film 140. The first connection electrode 214, the interelectrode insulating film 162, the second connection electrode 216, and the inorganic insulating film 180 are sequentially formed over the protective electrode 212, and the electrical connection is performed at the opening 180b in the inorganic insulating film 180.

5. Prevention of Vcom Shift

As described above, the display device 100 is an FFS-type transmissive liquid crystal display, and the gradation of the light emitted from the backlight and then passing through the liquid crystal layer is controlled pixel-by-pixel by controlling the orientation of the liquid crystal molecules in the liquid crystal layer 158 pixel-by-pixel. Therefore, the first orientation film 156, the second orientation film 160, the color filter 168, the light-shielding film 166, and the like are always exposed to the light from the backlight when the display device 100 is driven, resulting in the generation of holes and electrons in these films by photoexcitation. In a display device without the inorganic insulating film 180, the first orientation film 156 is in contact with the common electrode 154. When the driving transistor 130 is turned on in this state, electrons are injected from the common electrode 154 into the first orientation film 156. As a result, the holes partly disappear in the first orientation film 156 due to recombination to result in an electron-rich state, causing disruption of the charge balance in the first orientation film 156.

Thereafter, the driving transistor 130 is turned off after a predetermined time period. Here, in the case where the off current of the driving transistor is relatively large, for example, the charge balance in the first orientation film 156 is rapidly recovered because a part of the charge is transferred through the pixel electrode 152 and semiconductor film 132 even in the off state. However, the off current of the driving transistor 130, which includes an oxide semiconductor in the semiconductor film 132 as described in the present embodiment, is extremely low and negligible. Therefore, recovery of the charge balance in the first orientation film 156 is slow, and the charge unbalanced state is maintained. If such a phenomenon occurs, the charge bias accumulates every time the driving transistor 130 is turned on, which is considered to aggravate the polarization of the other layers. For example, it is considered that the charge bias even affects the polarization of the light-shielding film 166 on the counter substrate 104 side and that the polarization of the light-shielding film 166 further promotes a potential shift (Vcom shift) of the common electrode 154 on the array substrate 102 side. This phenomenon tends to be particularly remarkable when the light-shielding film 166 with a high dielectric constant is provided. Since such a Vcom shift may cause flicker generation, the display quality degrades.

In contrast, in the display device 100 according to an embodiment of the present invention, the inorganic insulating film 180 is provided between the common electrode 154 and the first orientation film 156. Hence, electron injection from the common electrode 154 to the first orientation film 156 does not occur even when the driving transistor 130 is turned on. Therefore, even though the off current of the driving transistor 130 is negligible, recombination in the first orientation film 156 is suppressed, resulting in suppression of the Vcom shift. Therefore, implementation of an embodiment of the present invention enables the production of a liquid crystal display device with high display quality in which flicker generation is suppressed.

The aforementioned modes described as the embodiments of the present invention can be implemented by appropriately combining with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

It is understood that another effect different from that provided by each of the aforementioned embodiments is achieved by the present invention if the effect is obvious from the description in the specification or readily conceived by persons ordinarily skilled in the art.

What is claimed is:

1. A display device comprising:
    a substrate;
    a plurality of pixels over the substrate; and
    a terminal outside a display region where the plurality of pixels is arranged,
    wherein at least one of the plurality of pixels comprises:
        a driving transistor including an oxide semiconductor; and
        a liquid crystal element electrically connected to the driving transistor,
    the liquid crystal element comprises:
        a pixel electrode;
        an interelectrode insulating film over the pixel electrode;
        a common electrode located over the interelectrode insulating film and having a slit overlapping the pixel electrode;
        an inorganic insulating film over the common electrode;
        a first orientation film over the inorganic insulating film;
        a liquid crystal layer over the first orientation film; and
        a second orientation film over the liquid crystal layer,
    the terminal comprises:
        a wiring in the same layer as a source electrode of the driving transistor;
        the inorganic insulating film over the wiring;
        a protective electrode located over the wiring, electrically connected to the wiring, and existing in the same layer as a drain electrode of the driving transistor; and
        a connection electrode located over the protective electrode and existing in the same layer as the common electrode,
    the inorganic insulating film has an opening exposing the wiring, and
    the connection electrode is exposed from the inorganic insulating film in the opening.

2. The display device according to claim 1,
    wherein the inorganic insulating film includes a silicon-containing inorganic compound.

3. The display device according to claim 2,
    wherein the silicon-containing inorganic compound is selected from silicon nitride, silicon oxide, silicon nitride oxide, and silicon oxynitride.

4. The display device according to claim 1,
    wherein the inorganic insulating film is in contact with the interelectrode insulating film in the slit.

5. The display device according to claim 1,
    wherein the inorganic insulating film has an opening overlapping the pixel electrode.

6. The display device according to claim 5,
    wherein the interelectrode insulating film and the first orientation film are in contact with each other in the opening.

7. The display device according to claim 5,
    wherein the common electrode is sealed by the interelectrode insulating film and the inorganic insulating film in each of the plurality of pixels.

8. The display device according to claim 1,
    wherein the driving transistor comprises:
        a gate electrode;
        a semiconductor film overlapping the gate electrode and including the oxide semiconductor;
        a gate insulating film between the gate electrode and the semiconductor film;
        an interlayer insulating film covering the gate electrode and the semiconductor film; and
        the drain electrode, which is electrically connected to the semiconductor film via a through hole provided to the interlayer insulating film, and
    the interlayer insulating film is exposed from the inorganic insulating film at an edge portion of the substrate.

* * * * *